United States Patent [19]

Rogers

[11] Patent Number: 5,444,378
[45] Date of Patent: * Aug. 22, 1995

[54] BATTERY STATE OF CHARGE MONITOR

[75] Inventor: Wesley A. Rogers, Grosse Pointe Park, Mich.

[73] Assignee: Electronic Development Inc., Grosse Pointe Park, Mich.

[*] Notice: The portion of the term of this patent subsequent to Jan. 12, 2010 has been disclaimed.

[21] Appl. No.: 919,011

[22] Filed: Jul. 23, 1992

Related U.S. Application Data

[63] Continuation-in-part of Ser. No. 607,237, Oct. 31, 1990, Pat. No. 5,179,340, which is a continuation-in-part of Ser. No. 218,539, Jul. 13, 1988, Pat. No. 4,968,941.

[51] Int. Cl.⁶ ............................................. G01N 27/416
[52] U.S. Cl. .................................. 324/428; 324/431; 320/48
[58] Field of Search ............... 324/426, 427, 428, 431; 320/48; 340/636

[56] References Cited

U.S. PATENT DOCUMENTS

| | | | |
|---|---|---|---|
| 3,805,157 | 4/1974 | Acks et al. | 324/428 |
| 4,388,618 | 6/1983 | Finger | 340/636 |
| 4,740,754 | 4/1988 | Finger | 324/428 |
| 4,947,123 | 8/1990 | Minezawa | 324/427 |
| 4,968,941 | 11/1990 | Rogers | 324/428 |
| 5,179,340 | 1/1993 | Rogers | 324/428 |

OTHER PUBLICATIONS

Ferrgiolo et al., "Available Battery Time Sensor", vol. 16, No. 5, Oct., 1973.

Primary Examiner—Kenneth A. Wieder
Assistant Examiner—Glenn W. Brown
Attorney, Agent, or Firm—Davis Hoxie Faithfull & Hapgood

[57] ABSTRACT

An apparatus and method for monitoring the state of charge of the battery having a shunt resistor connected in series with a battery and an integrating circuit connected across the terminals of the shunt resistor which includes a large capacitance element having the capability to store charge for long periods of time, so that the integration can be performed along the same curve even if power to the integrating circuit is interrupted during continuous or intermittent use. The apparatus and method are applicable to batteries for automotive vehicles. Temperature compensation schemes to adjust the state of charge monitoring circuit to correct for changes in battery performance characteristics with temperature are provided. A circuit for detecting the existence of a defective battery cell is provided. A system for monitoring charging and discharging of the battery over time and identifying various battery conditions and potential battery or battery charging system failures is provided.

65 Claims, 5 Drawing Sheets

BATTERY STATE OF CHARGE MONITOR

RELATED APPLICATIONS

This application is a continuation-in-part of U.S. patent application Ser. No. 07/607,237, filed Oct. 31, 1990, in the name of Wesley A. Rogers and entitled Apparatus for Monitoring The State of Charge of a Battery, now issued as U.S. Pat. No. 5,177,340, which is a continuation-in-part of U.S. application Ser. No. 07/218,539, filed Jul. 13, 1988, in the name of Wesley A. Rogers and entitled Apparatus For Monitoring the State of Charge of a Battery, now issued as U.S. Pat. No. 4,968,941.

FIELD OF THE INVENTION

This invention relates to improved devices for monitoring the state of charge of a battery, more specifically, to more efficient devices for monitoring the state of charge of an automobile vehicle battery and providing diagnostic capability under varying temperature conditions.

BACKGROUND OF THE INVENTION

In the normal operation of an automotive vehicle, a 12-volt battery is used to start the engine and to operate accessories at times when the motor is not running. An alternator is used to recharge the battery after each start and to maintain it fully charged. Once the engine is started the alternator is driven by the rotation of the engine crankshaft.

Conventional automotive batteries have six cells connected in series with thin cell plates and are well suited to developing large starting currents of 240 amps. It has long been the practice, in order to insure that the battery is adequately charged following a start discharge, to maintain a recharging current flow to the battery at a level that varies as a function of ambient temperature. This results in trickle charge currents. These trickle charge currents cause prior known battery state of charge monitors to indicate erroneously greater than a 100% charge. This results in erroneous state of charge readings.

It is known to monitor the state of charge of a battery to determine, for example, whether a battery is fully charged, depleted of charge, or partially charged. One such technique calls for measuring the specific gravity of the electrolyte of each cell of the battery using a hydrometer. The determined specific gravity can be compared to the specific gravity of the battery in a fully charged state to obtain a relative state of charge.

Another technique uses a current counter which continuously registers the net current from automotive battery and is disclosed in the ELV Journal No. 45, dated May/June 1986. That technique measures the voltage drop across a precision shunt resistor in series with the monitored battery. The voltage is amplified and drives a voltage to frequency converter, the output of which is fed into an up/down counter. The counter counts up or down while the battery is discharged or being charged respectively, and may drive an integrated display. The display is initialized when the counter is first connected to a fully charged battery and displays the net current flow from the battery. For continuous monitoring, the display must be continuously energized by a power source so that the counter will not lose the net count through loss of power. U.S. Pat. No. 4,968,941, which issued to the assignee of the present invention, teaches a battery state of charge monitoring circuit ("BSOC circuit") including a shunt resistor in series with the battery and a circuit for integrating the voltage drop across the shunt having a very large capacitance in the feedback path. The large capacitance device, such as a Super Capacitor having a capacitance between 0.01 and 1 farad or more, integrates the current flow into and out of the battery over time, respectively, and thus maintains a charge at a level corresponding to the battery state of charge. The charge is maintained for long periods of time whether or not the element is connected to a power supply because of the long RC time-constant of the integrator amplifier circuit and a very low self-discharge rate of the capacitive device. The BSOC circuit may be connected to a display and initialized with a fully charged battery so that the voltage stored in the large capacitance device represents the state of charge of the battery. Alternatively, the BSOC circuit may be connected to a discharged battery such that the capacitive device is charged up with the battery.

The present invention concerns improvements to the basic BSOC circuit disclosed in U.S. Pat. No. 4,968,941, the disclosure of which is hereby incorporated by reference in its entirety.

SUMMARY OF THE INVENTION

It is an object of the present invention to provide a battery state of charge ("BSOC") device for an automotive vehicle that is more efficient than prior known devices. It is another object to provide a BSOC device that is permanently connected to the battery being monitored.

It is another object of the invention to combine monitoring the state of charge of a battery and the charging current applied to the battery after it reaches full charge to identify a defective battery.

It is another object of the invention to monitor the state of charge of a battery and to compensate for changes in the battery operating characteristics such as temperature, load current magnitude, and self-leakage.

It is another object of the invention to warn the vehicle operator of a low battery state of charge or a defective battery condition.

In accordance with the present invention, apparatus, systems, and methods are provided for monitoring continuously the state of charge of an electrical energy source, in particular, a battery of an automotive vehicle.

One aspect of the present invention concerns providing the BSOC circuit with one or more temperature compensation circuits for tracking changes with temperature of the battery characteristics, such as battery capacity and the self-discharge rate of the battery and the BSOC circuit. For example, in colder temperatures the charging voltage delivered by a conventional battery charging system, i.e., the alternator, to recharge the battery is increased to compensate for the lower battery capacity at those temperatures and is reduced below the 72° F. level in warmer ambients. Similarly, at the colder temperatures, the self-discharge rate of the battery will become lower than at warmer temperatures. Accordingly, improvements in tracking the charge capacity of the battery being monitored are obtained by adjusting the characteristics of the BSOC circuit to correspond to charges in the battery characteristics with changing temperature. This yields a more accurate model of the battery and its measured charge.

Another aspect of the invention concerns improved methods and apparatus for monitoring of the state of an electrical energy source having a charge capacity and a self-discharge rate that changes with temperature. One such apparatus includes:

- a current sensor operatively connected to the energy source for producing an output signal related to the magnitude and direction of the current flowing to or from said energy source;
- a low self leakage capacitive element having a capacitance of 0.01 farad or more connected to said current sensor for integrating said output signal and for producing a signal related to the state of the energy source, said capacitive element charging at a rate proportional to the magnitude of the sensed current when the current flow is in one direction, and discharging at a rate proportional to the magnitude of the sensed current when the current flow is in the opposite direction, on a continuous basis as the current flows to and from said energy source;
- a device for monitoring the temperature of the energy source; and
- a circuit for adjusting the integrated signal in response to the temperature of the energy source so that the integrated signal corresponds to the state of charge of the energy source at the sensed temperature.

Preferably, the current sensor is a shunt in series with the energy source, the apparatus includes an operational amplifier having the capacitive element in the feedback path and an input resistor across which the output signal from the current sensor is passed for integrating the output signal, and the device for monitoring temperature is a thermistor placed in physical proximity to the energy source. Although immersion of the temperature monitoring device inside the energy source would be optimal, it is believed to be sufficient for most circumstances that the device be placed in the same ambient conditions as the energy source, optionally in touching contact. Thus, in the context of an automobile, sensing ambient temperature in the engine compartment near the battery will suffice, particularly in view of the minimal thermal heating of the battery due to increasing engine temperature.

In one such preferred embodiment, the adjusting circuit includes the thermistor in series with the amplifier output and a resistor divider network. This circuit adjusts the output voltage of the operational amplifier to correspond to the charge capacity of the battery at the sensed temperature. In this embodiment, the capacitive element is charged and discharged at preselected rates that do not change with temperature and only the integrated output signal is adjusted. Thus, the signal input into the adjusting circuit is the integrated output signal of the amplifier corresponding to the instantaneous state of charge of the battery independent of the temperature, and the adjusting circuit provides at its output a signal corresponding to the charge capacity of the battery at the sensed temperature. Both signals are useful for diagnostic purposes as described below.

In another such preferred embodiment, the adjusting circuit includes a circuit for adjusting the rates at which the capacitive element is charged or discharged to reflect changes in the capacity of the battery with changes in the sensed temperature at the time of charge or discharge, and so that the integrated output signal corresponds to the state of charge of the battery at the sensed temperature. In this regard, the circuit may be a balance circuit incorporating the thermistor which controls the offset voltage of the amplifier. This results in altering the charging rate and discharging rate of the capacitive element as a function of the sensed temperature. Alternatively, the circuit may include a thermistor for adjusting the selfdischarge rate of the capacitive element in response to the sensed temperature. In this embodiment, the output of the amplifier reflects the state of charge as a function of temperature. Preferably, the circuit includes both the balance circuit and the circuit for adjusting the self discharge rate.

Another aspect of the invention concerns improving the efficiency of the state of charge circuit elements to avoid the need for operation in a standby mode and an active mode, such that the standby mode has a reduced drain current on the energy source when the energy source current flow is below selected thresholds corresponding to being in use. In this regard, the invention concerns using low power operational amplifiers having supply voltages provided directly from the energy source being monitored, for sensing and integrating the current flow charged to and discharged from the capacitive element. Advantageously, the amplifier has a drain current of about 0.2 mA and the entire state of charge monitoring circuit has a drain current of approximately 2 mA or less.

Another aspect of the invention concerns detecting the existence of a defective cell in the energy source. In one embodiment, a first circuit is used to determine when the integrator amplifier output reflects a full charge, namely a charge that is a high percent of 100% charge. A second circuit is used to determine when there is a charging current to the energy source, namely when the current flow into the energy source is above a threshold current level representative of a charging current. A third circuit is used for determining when the energy source is fully charged and also has a charging current above the threshold level, which conditions are representative of a defective cell. Preferably, the energy source is a multi-cell battery, and the full charge level and threshold current levels are selected to correspond to one or more cells of the battery having a short circuit. In another embodiment, the apparatus includes a diagnostic meter for immediately indicating when there exists a full charge and excessive charging current.

Another aspect of the invention concerns detecting when the energy source is fully charged and when there is a trickle charging current to the energy source. This circuit is used to prevent the integrating amplifier from integrating the trickle charging current and indicating more than 100% charge.

In another embodiment, the BSOC circuit is coupled to a microprocessor that monitors the polarity and magnitude of current flow across the shunt over time to determine when the energy source charging and discharging operating characteristics are acceptable or unacceptable, and for providing an indication of the characteristics to the vehicle operator.

It should be understood that the various aspects of the invention may be used jointly and severally, are not limited to monitoring the state of charge of a battery for automotive vehicles, and are applicable to monitoring any rechargeable electrical energy storage device that is connected to operate an electrical load, for example, household or industrial appliances, a battery powered vehicle or device, aircraft, spacecraft, watercraft or emergency lighting.

BRIEF DESCRIPTION OF THE DRAWINGS

Further features of the invention, its nature and various advantages will be more apparent from the accompanying drawings and the following detailed description of the invention, in which like reference numerals refer to like elements, and in which.

DETAILED DESCRIPTION OF THE INVENTION

Figure 1:
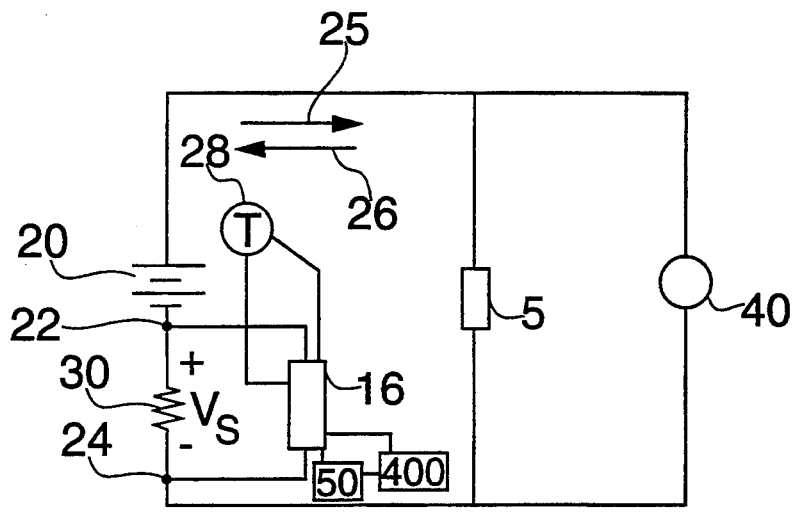
FIG. 1 and 1A are respectively battery state of charge monitors connected across a shunt resistor in a circuit in accordance with various aspects of the present invention.
Figure 1A:
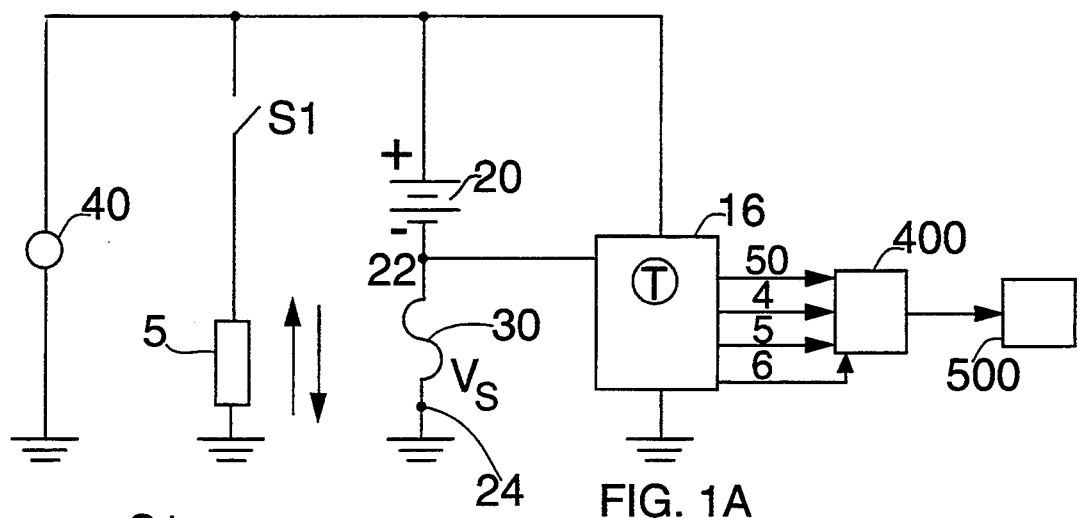

Referring to FIGS. 1 and 1A of the drawings, a Battery State of Charge (BSOC) monitor 16 is illustrated in a circuit with a battery 20, such as a 12 volt automotive battery or any other energy storage device, which supplies power to a load 5, such as a starter motor or electrical circuits in an automobile, and which can be charged by an alternator/battery charger 40. A shunt resister 30 is in series with the battery 20 and the load 5. Referring to FIG. 1, the input terminals of the BSOC monitor 16 are connected to the terminals 22 and 24 of the shunt resister 30. Referring to FIG. 1A, the input terminals of BSOC monitor 16 are connected to terminal 22 of shunt 30 and to ground, with the other terminal of shunt 30 being connected to ground.

Figure 7:
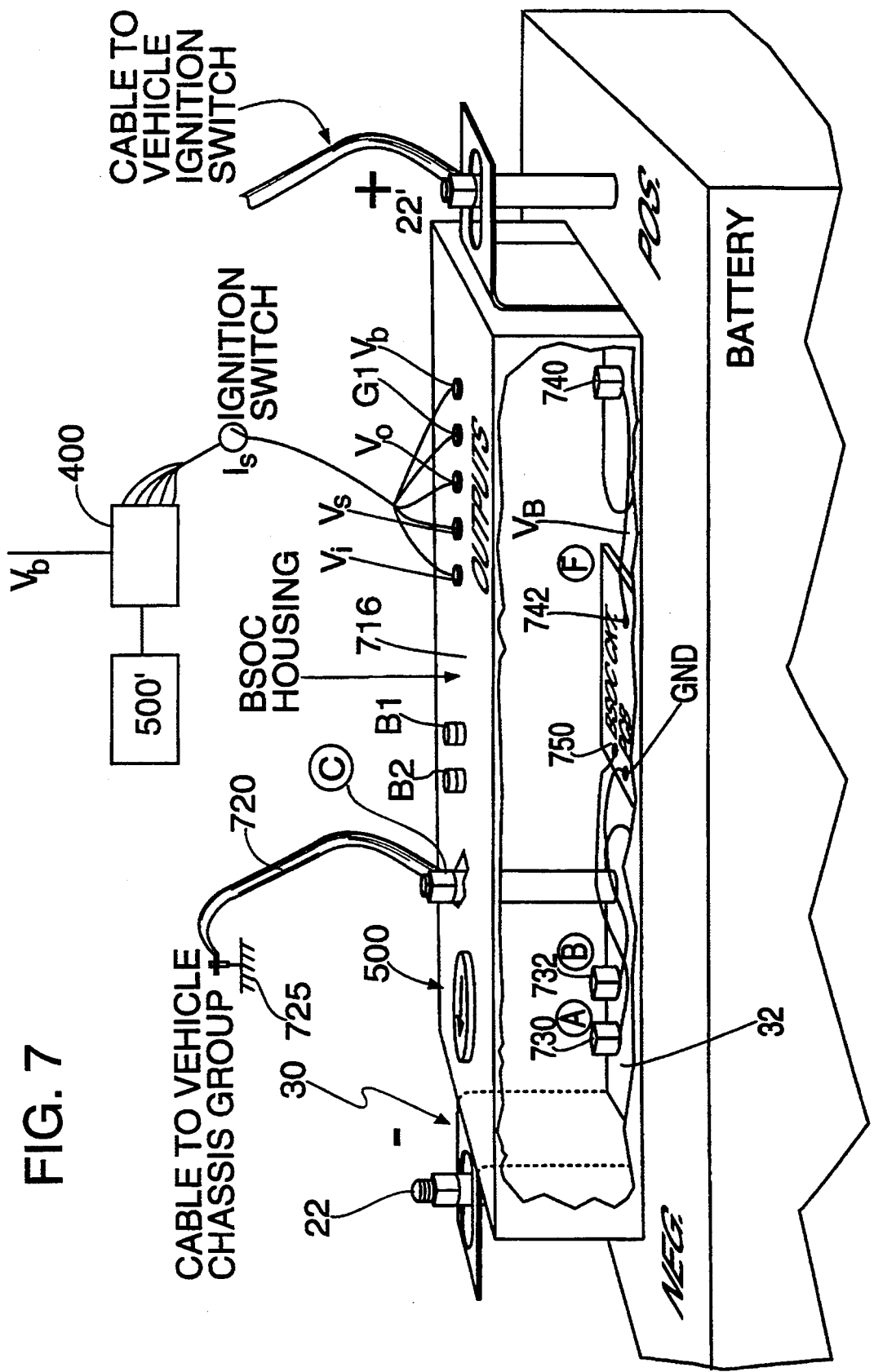
FIG 7 is a elevated perspective sectional view of a battery state of charge monitor of FIG. 1.

A temperature monitoring device 28, such as a thermistor, is placed in proximity to battery 20 and is electrically connected to BSOC monitor 16 for adjusting the output level of BSOC monitor 16 in response to changes in temperature. Preferably, temperature monitor device 28 is located in the BSOC monitor enclosure 716 which is mounted between the battery terminals as illustrated in FIG. 7.

Shunt resistor 30 is connected in series with battery 20 and load 5, preferably interposed between the negative pole of battery 20 and ground, wherein load 5 presented by the vehicle is connected between the positive terminal of battery 20 and ground. Consequently, the voltage drop V, across shunt resistor 30 is related to the current flowing through battery 20 by its scale factor (MV/AMP). The current can be either in direction 25 or 26, depending on whether battery 20 is discharging current to load 5 or being charged by alternator/battery charger 40, respectively.

Voltage $V_s$ across shunt 30 is input to BSOC monitor 16 which produces an output signal $V_i$ that corresponds to state of charge of battery 20. BSOC monitor 16, therefore, tracks amp hours into and out of the battery 20 by acting as a model of the battery 20.

Figure 2:
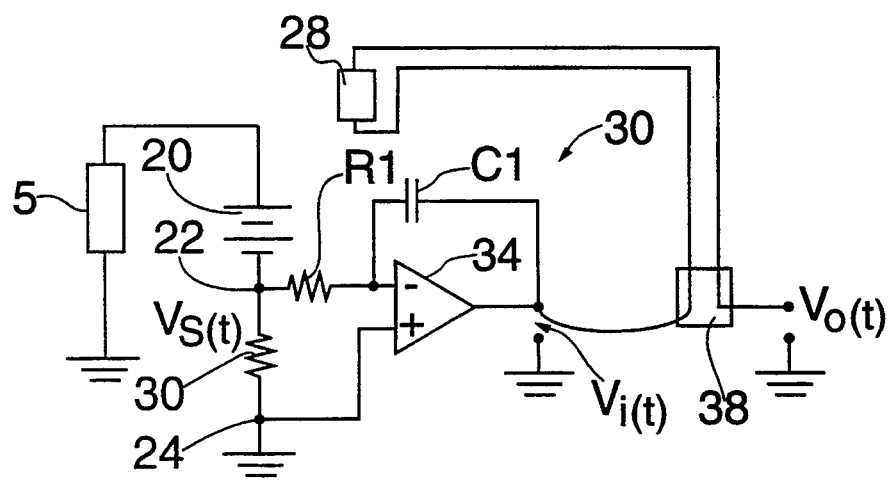
FIG. 2 is a schematic of one embodiment of an integrating circuit of a battery state of charge circuit with temperature compensation in accordance with the present invention.

FIG. 2 shows one embodiment of BSOC monitor 16 as an inverting integrating circuit, in accordance with the temperature compensation aspect of the present invention. A resistor R1 is connected in series with an input voltage $V_s$ and the inverting input of an operational amplifier 34. A device C1, having a large capacitance, is in the feedback path of amplifier 34. The large capacitance device C1 is preferably a super capacitor, for example, product number FYHOH105Z manufactured by NEC Corporation, which is capable of storing a charge for up to three years. The output of this circuit $V_i(t)$, is as follows:

$$V_i(t) = - (1/R1*C1) \int_o^t V_s(t)dt + c$$

where $V_s(t)$ is the voltage drop across shunt resistor 30 over time t, and c is a constant of integration which equals the initial charge on the device 36.

Signal $V_i(t)$ is then processed by circuit 38 which includes temperature monitoring device 28 in proximity to battery 20, for adjusting the signal $V_i(t)$ as a function of sensed temperature. The output of circuit 38 is signal $V_o(t)$ which is representative of the charge capacity of battery 20 at the sensed temperature.

Figure 3:
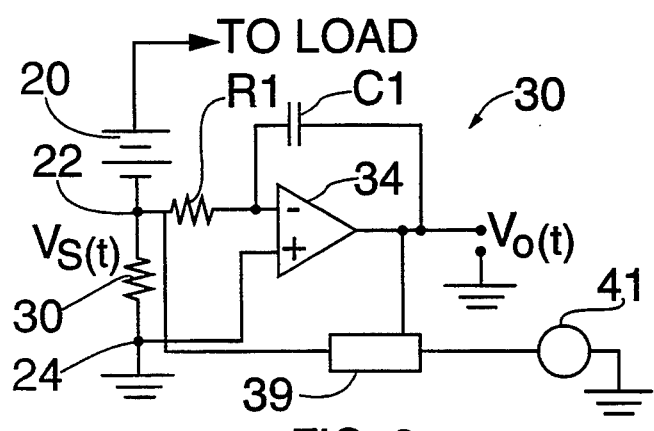
FIG. 3 is a schematic of one embodiment of an integrating circuit of a battery state of charge circuit with a defective battery sensing circuit in accordance with the present invention.

FIG. 3 shows one embodiment of BSOC monitor 16 as an inverting integrating circuit in accordance with the defective battery sensing embodiment of the present invention. In this embodiment, the integrating circuit includes resistor R1 connected in series with an input voltage $V_s(t)$, and the inverting input of operational amplifier 34, and large capacitance device C1 in the feedback path in series with resistor R1. A circuit 39 is provided for monitoring the current flow into and out of battery 20 and the integrated output signal $V_i(t)$, and for actuating a warning device 41 when the sensed charge and charging current indicate that battery 20 is defective. Warning device 41 may be, for example, an indicator light on an instrument panel of a vehicle or a logic gate polled by a microprocessor or a state device.

Figure 3A:
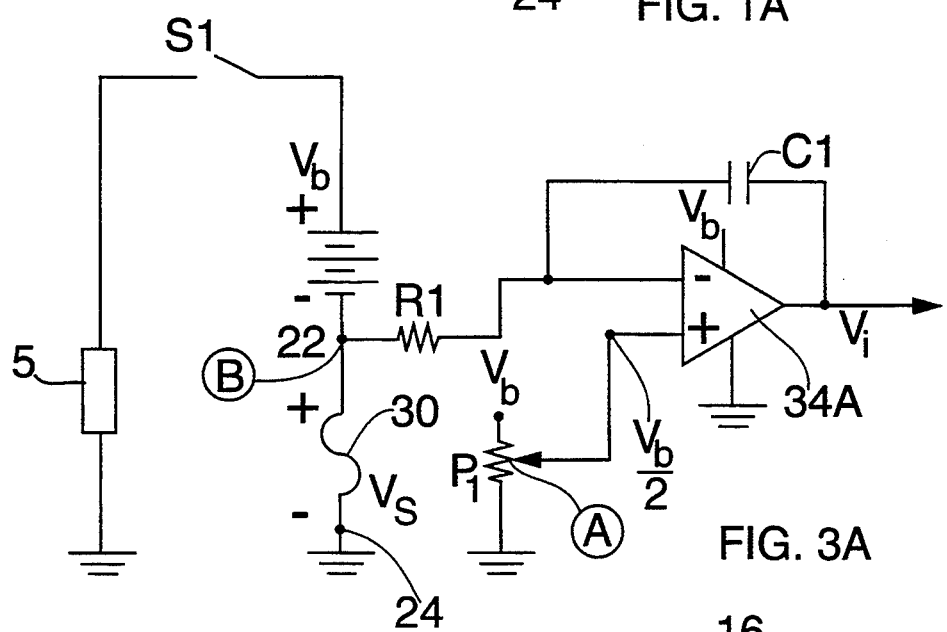
FIG. 3A is a schematic of an inverting double integrating circuit configuration of FIG. 1A.

FIG. 3A shows an embodiment of BSOC monitor 16 in an inverting, double-ended integrating circuit configuration. In this embodiment, the inverting input of operational amplifier 34A is connected in series with input voltage $V_s(t)$ across input resistor R1 with large capacitance device C1 in the feedback loop. The non-inverting input of amplifier 34A is connected in series with battery 20 voltage $V_b$ across a potentiometer P1. Operational amplifier 34A also is configured with the positive reference voltage connected to battery 20 and the negative reference voltage connected to ground. Potentiometer P1 is adjusted to provide a voltage input of one half the rated voltage of battery 20 on the non-inverting input, e.g, 6 volts for a 12 volt battery. This places an integrator output voltage $V_i$ at 6 volts with no voltage appearing at the top of shunt 30. Although usable in a BSOC monitor 16, this embodiment requires shunt scale factor (mV to A) adjustments which are not required with the non-inverting input configuration shown in FIG. 3.

Figure 4:
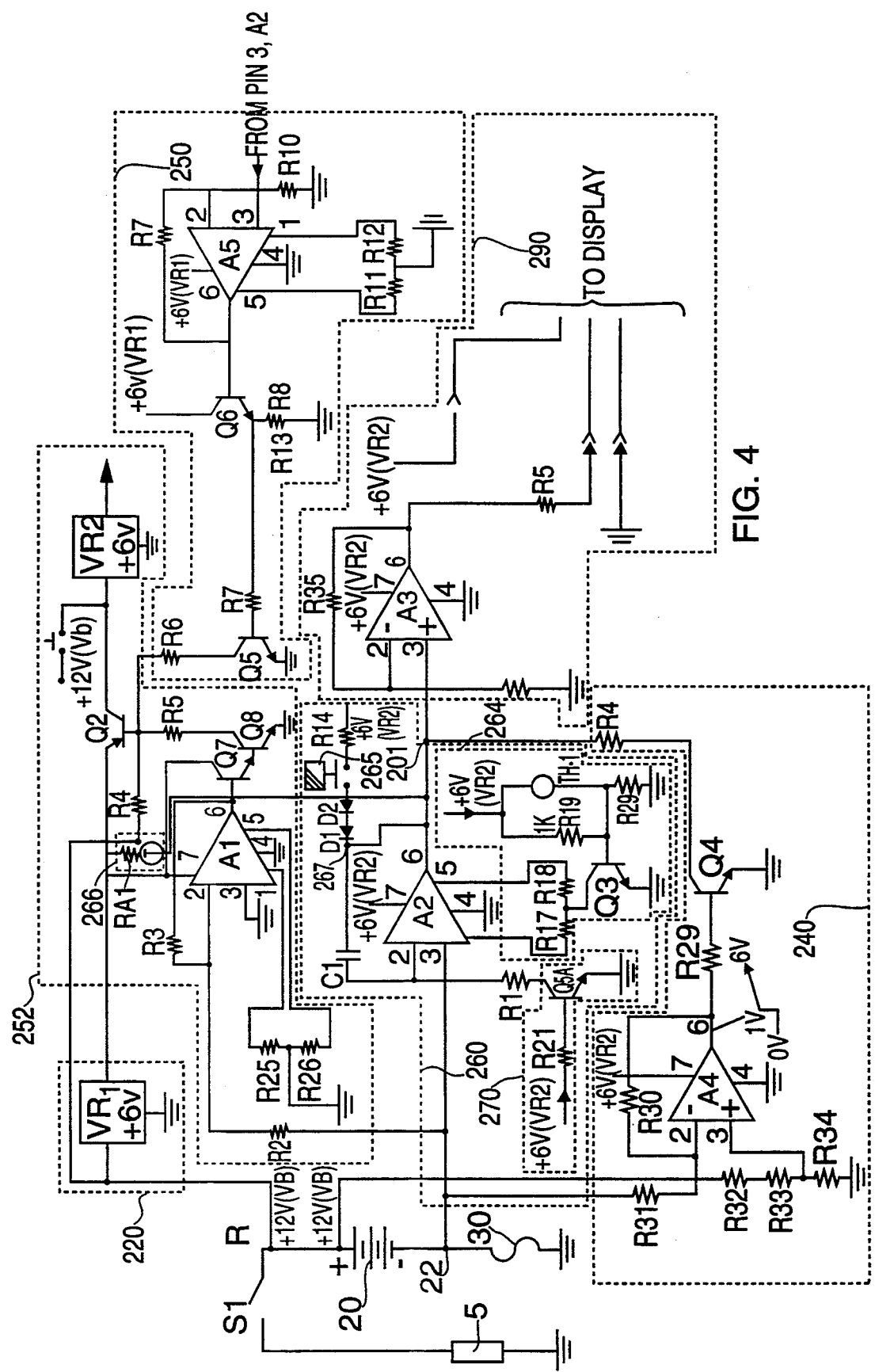
FIG. 4 is a schematic diagram of a battery state of charge monitor in accordance with a preferred embodiment of the present invention.

Referring to FIG. 4, one embodiment of a BSOC monitor 16 is shown. BSOC monitor 16 includes standby power circuit 220, battery discharge turn-on circuit 230, start circuit 240, battery charge turn-on circuit 250, integrator circuit 260, and display driver circuit 290. In this embodiment, BSOC monitor 16 operates in one of a standby or off mode and an operating mode. In the standby mode, BSOC monitor 16 consumes a standby current of about 0.8 ma. This current is used by battery discharge turn-on circuit 230 and battery charge turn-on circuit 250 to monitor any significant discharge and charge of battery 20, respectively. BSOC monitor 16 changes from its standby to operating mode when a sufficient discharge or charge is detected. In the operating mode, BSOC monitor 16 has an operating current of about 45 ma for the various circuit functions which are described below.

Standby power circuit 220 includes a conventional voltage regulator VR1 that produces a regulated +6.0 volts dc output. In the standby mode, regulator VR1 is energized directly from battery 20. The +6 volt output signal is used to energize amplifier A1 of battery discharge turn-on circuit 230 and amplifier A5 of battery charge turn-on circuit 250. The +6 volt signal also is used as the voltage source of the collector currents for transistors Q7 and Q8 of battery discharge turn-on circuit 230 and transistor Q6 of battery charge turn-on circuit 250. The collector of transistor Q2 also is directly energized by battery 20.

In the standby mode, amplifier A1 has no output and transistors Q7 and Q8 are turned off. This results in transistor Q2 being off and no voltage being applied to the input of voltage regulator VR2 of discharge turn-on circuit 230. Consequently, start circuit 240 and integrator circuit 260 are off and the drain current on battery 20 is minimized.

Battery discharge turn-on circuit 230 is provided to turn on the circuit when battery 20 is discharging. When a load of −0.1 amps or more is drawn from battery 20, a voltage of −0.2 mv or higher appears across resistor R2 and is amplified across resistor R3 by amplifier A1. The amplified positive voltage at pin 6 of amplifier A1 turns transistors Q7 and Q8 on. This reduces the base of transistor Q2 to ground potential and thus turns on transistor Q2. As a result, transistor Q2 then applies the 12 volts at the collector of transistor Q2 to the input of voltage regulator VR2. This provides voltage regulator VR2 with a regulated output voltage of +6 volts dc. The +6 v supply is provided to amplifiers A2, A3, and A4 and provides the reference or source voltage of +6 (VR2) as indicated on the schematic of FIG. 4 for integrator circuit 260, display driver circuit 290, and start circuit 240. When this occurs, BSOC monitor 16 is fully operational.

By way of example, the current required to turn on a single light bulb in a conventional automotive vehicle such as when a door is opened is about 1.0 amp. Accordingly, shunt resistor 30 may be selected to produce about 2.0 mv thereacross for every amp discharged from battery 20. This scale factor (MV/AMP) provides an adequate voltage output level at relatively low turn-on currents and provides acceptable signal processing. Of course, a shunt resistor having a different mv to ampere ratio could be used, e.g., 1 mv to 1 ampere, subject to adjustments of the signal processing circuits to determine the battery state of charge, which adjustments are within the ability of a person of ordinary skill in the art. With a 1 mv to 1 ampere ratio, an operational amplifier capable of detecting and amplifying 0.5 mv voltage swings as small as 0.5 mv and as large as 200 mv is desirable, such as the RCA Model No. CA 3140AE, operating in a single ended mode.

Battery discharge turn-on circuit 230 also may be provided with a manual switch 232 for connecting voltage regulator VR2 directly to battery 20. This is useful for manually turning on BSOC monitor 16 for diagnostic purposes, in particular to determine whether or not BSOC monitor 16 is accurately measuring the state of charge of battery 20.

Battery charge turn-on circuit 250 is provided to turn on BSOC monitor 16 when battery 20 is being charged. In this regard, when a +0.2 volt or greater input appears across shunt 30, that signal will be amplified by amplifier A5 to produce a signal that turns on transistors Q6 and Q5 to turn on transistor Q2, thereby changing BSOC monitor 16 from the standby mode to the operating mode.

By way of example, during vehicle operation with a fully charged battery, currents of as low as 1 ampere are supplied to the input terminal of battery 10. This current produces a +2.0 mv signal across shunt 30 (assuming that a shunt having a 2 mv to 1 ampere ratio is used), which signal is then amplified to turn on pass transistor Q2.

Turning BSOC circuit 16 on enables integrator circuit 260 to track changes in the state of charge of battery 20. Integrator circuit 260 preferably comprises an operational amplifier A2 having a very large capacitance device (hereinafter a "capacitor") C1 having a long time-constant in the feedback loop connecting the output at pin 6 of amplifier A2 to the inverting input at pin 2 of amplifier A2. Capacitor C1 may be a super capacitor having a capacitance of 0.01 farad or greater, e.g., model FYH0H105Z manufactured by NEC Corporation, a "gold capacitor," model NF series P/N EECF5R0105 available from Panasonic, or a similar device that has a long time-constant and is capable of storing a charge over substantially long time periods of many months or years. The non-inverting input at pin 3 of amplifier A2 is connected to shunt 30 at node 32 and the inverting input at pin 2 of amplifier A2 is connected to ground potential through resistor R1 and integrator discharge interrupter circuit 270.

Integrator discharge interrupter circuit 270 includes transistor Q5A configured with the collector connected to resistor R1, the emitter connected to ground potential, and the base connected to the +6 volt source voltage from voltage regulator VR2 across limiting resistor R21. When BSOC monitor 16 is in the standby mode, the voltage from VR2 is 0 and transistor Q5A is turned off. Thus, there is substantially no leakage current flowing out of capacitor C1. When BSOC monitor 16 is in the operational mode, the voltage from regulator VR2 is +6 volts, transistor Q5A is turned on, and resistor R1 is thus connected to ground potential. This in turn allows integrator circuit 260 capacitor C1 to charge or discharge through resistor R1.

In the operating mode, the current flow into and out of battery 20 passes through shunt 30 and the voltage generated across shunt 30 is detected and integrated by amplifier A2. The output of amplifier A2 at pin 6 thus represents the net amp hours into and out of the battery. This provides an accurate indication of the state of charge of battery 20 by integrating the current into and from battery 20 (or other energy storage device) over time.

The components of integrator circuit 260 and shunt 30 are selected to allow integrator circuit 260 to follow the discharge curve of battery 20. For example, if a shunt resistance of 2 mv per ampere is selected for use with an 80 amp-hour battery having a 1 ampere discharge rate and a capacitor having a voltage range of from 0 to 100 mv and a capacitance of 1.8 farads, then for integrator circuit 260 to track linearly the battery discharge, resistor R1 must be selected to satisfy the following equation:

$$V_i = V_s (t/RC)$$

wherein:
"$V_i$" is the maximum output of the integrator (i.e., 100 mv);
"$V_s$" is the voltage across shunt 30 (i.e., 2 mv for 1 amp);
"t" is the discharge time for an 80 amp-hour battery at 1 amp (i.e., 280,000 seconds);
"R" is the resistance of R1; and
"C" is the capacitance of C1 (i.e., 1.8 farad).

Thus, solving for R1, it is determined that the resistance for R1 should be 3.2 kohms. Once the proper resistance is selected, integrator circuit 260 will track the discharge path of battery 20 regardless of the discharge rate, except during substantially high current drains, which occur, for example, during starting, as explained below. It is noted that the use of 100 mV output of the integrator was based on the capacitive device being a MEMORIODE, which had been made by Sanyo Ltd. and which is no longer in commercial production. A MEMORIODE had a maximum charge storage of about 100 mV. Super Capacitors are not so limited and may store, for example, up to 6 volts.

Amplifier A2 is provided with various time constants corresponding to the one amp discharge time of battery 20 being monitored.

Start circuit 240 performs two functions. First, it rapidly discharges integrator circuit 260 during high current drains as occur during starting of the vehicle, and second, it gradually increases the integrator discharge rate to simulate loss of battery capacity under heavy current drain. Circuit 240 includes operational amplifier A4 which is configured to amplify the negative shunt voltage across resistor R31 to turn on transistor Q4. Turning transistor Q4 on causes the output of integrator amplifier A2 to pass to ground over time.

Amplifier A4 is provided with resistor R30 in the feedback path between the output at pin 6 and the inverting input at pin 2. The inverting input at pin 2 is connected to node 32 across resistor R31, and the non-inverting input at pin 3 is connected directly to battery 20 through a voltage divider network including resistors R32, R33, and R34. Resistors R33 and R34 are selected to provide a 0.1 volt offset on pin 3 of amplifier A4. The output of amplifier A4 is connected to the base of transistor Q4 across limiting resistor R29. The emitter of transistor Q4 is passed to ground potential and the collector is connected to the output of integrator amplifier A2 across resistor R4.

The offset voltage provided at pin 3 of amplifier A4 prevents amplifier A4 from turning on until a voltage equal to or greater than −0.1 volts appears across resistor R31. The value of resistor R31 is selected so that a −0.1 volt level across resistor R31 corresponds to a 50 ampere discharge current through shunt 30. The gain of amplifier A4 is adjusted to provide 1 volt at the base of transistor Q4 at the time amplifier A4 is turned on. This will cause conduction through the base-emitter diode of transistor Q4 which reduces the collector voltage. The lower collector voltage initiates a current flow through resistor R4 to ground. As the amplitude of the voltage across R31 increases above −0.1 volt, transistor Q4 is driven into saturation and a large simulated start current is passed through resistor R4 to ground.

As a result, amplifier A4 is configured to act as a quasi Schmidt trigger having an output voltage that switches to 1 volt when the input voltage reaches 0.1 volt and then linearly increases to 6 volts in response to input voltage level increasing above −0.1 volts. This results in the removal of a charge from the integrator capacitor C1 that is proportional to the amount of charge removed from the battery during starting of the vehicle (or other rapid discharge).

In this embodiment of BSOC monitor 16, the output at pin 6 of amplifier A2 is passed to a display driver circuit 290 which operates a display device (not shown) for providing the state of charge of battery 20. Circuit 290 includes an amplifier A3 configured with a resistor R35 in the feedback path, the inverting input connected to ground, and a resistor R36 connected to the output pin 6 of amplifier A3. Amplifier A3 thus provides a gain for the integrator output signal $V_i$ at the non-inverting input pin 3 of amplifier A3. The gain is selected to be suitable for driving the selected display device. Circuit 290 may be used in conjunction with comparator circuits (not shown) having thresholds selected to indicate different ranges of charge of the battery.

The selected display device can be a visual device such as an analog ammeter or a digital display including an integrated circuit display having more than one visual display device, e.g., liquid crystal alphanumeric or bar graph displays, light emitting diodes or an audible device generating a variety of tones corresponding to various conditions. The display device may represent or indicate different state of charge conditions or provide a numerical value of the present charge. One such device may include an analog to digital converter and three different color LEDs, e.g., a green, yellow, and red LED representing a satisfactory state of charge, an unsatisfactory charge, and a dead battery-respectively, such that different LEDs or combinations of LEDs are energized depending on the magnitude of the digitized state of charge signal and whether the battery is being charged or discharged.

Integrator circuit 260 is preferably provided with an initialization switch or charge button 265 which, when closed, charges capacitor C1 up to its full charge voltage, e.g., 100 mv. Referring to FIG. 4, the amplifier output side of capacitor C1 is connected at node 267 to diodes D1 and D2, which are connected in series with the same polarity. Diode D2 is in turn connected to switch 265 which is connected across resistor R14 to the source voltage +6 volts from voltage regulator VR2. Accordingly, when switch 265 is depressed, the source voltage across resistor R14 is passed to diodes D1 and D2 which in turn close and charge capacitor C1. The rate of charge is selected to be slow enough so that an operator can monitor the display device and cease charging when the display indicates the known state of charge of battery 20. Thus, for a fully charged battery 20, switch 265 will remain depressed until capacitor C1 is fully charged as indicated on the display. If battery 20 is less than fully charged, which may be determined, for example, by measuring the specific capacity of the battery cells, then capacitor C1 can be charged until the appropriate state of charge appears on the display. When switch 265 is released, the connection between the source voltage and capacitor C1 is broken, the charging will cease, and capacitor C1 will retain the charge.

In accordance with the present invention, integrator circuit 260 also is provided with a temperature compensation circuit 264 which is used to adjust the time constant of circuit 260 for changes in the battery capacity with changing battery temperature. Battery capacity is reduced in a nearly linear manner as ambient temperature is decreased below 72 degrees F. and increases slightly at temperatures above 72 degrees F. Accordingly, the battery discharge time under a given load is greater at temperatures below 72 degrees F. than it is at temperatures above 72 degrees F. Therefore, it is desirable to sense for changes in battery temperature and alter the time constant of circuit 260 to simulate changes in battery capacity, and thereby better track the net current flow of battery 20.

Lower battery capacity may be simulated by increasing the discharge rate of C1 and thereby reducing the integrator time constant. This is implemented by imbalance circuit 264, which includes resistor R19 and thermistor TH1 connected in parallel between source voltage +6 volts from regulator VR2 and grounding resistor R20. The voltage across grounding resistor R20 is applied to the base of transistor Q3. The emitter of transistor Q3 is connected to ground and the collector is connected to resistors R17 and R18. Resistors R17 and R18 are respectively connected to pins 1 and 5 of amplifier A2 and thus presents an unbalance circuit which will respond to changes in ambient temperature as follows.

At 72 degrees F., the resistance of resistor R19 and thermistor TH1 are selected to be the same, at 1 kohm, so that circuit 264 is in balance. The balanced circuit conduction reduces the offset voltage of amplifier A2 to zero. Consequently, integrator circuit 260 will operate as determined by the (R1)(C1) time constant required to track the battery at 72 degrees F.

A decrease in the battery temperature is sensed by thermistor TH1 as an increase in its resistance. This unbalances circuit 264 and provides an applied offset voltage which causes amplifier A2 to discharge capacitor C1 at a greater rate and thus reduces the effective (R1)(C1) time constant of integrator circuit 260. When the temperature increases above 72 degrees F., integrator circuit 260 is altered in a manner that the effective (R1)(C1) time constant is increased. As a result, changes in battery capacity as a result of battery temperature changes are accounted for in integrating circuit 260.

A second temperature compensation circuit 266 also may be provided to compensate for differences in the self-discharge rates of capacitor C1 and battery 20 with changes in temperature. It has been discovered that the self-discharge rate of battery 20 changes with temperature at a rate that is different from, more specifically higher than, the self-discharge rate of a high capacitance long time-constant energy storage device such as capacitor C1. Accordingly, it is desirable to compensate for differences in the selfdischarge rates with changes in ambient temperature, and thereby better track the higher battery self-discharge rate at the various temperatures of operation.

Circuit 266 accomplishes this by inserting a resistor R1A and a thermistor TH2 connected in series between output pin 6 of amplifier A2 and the +6 volt supply of voltage regulator VR1. The resistance of resistor R1A and thermistor TH2 are selected so that the +6 volts will alter the output of amplifier A2 to compensate for the differential self-discharge rates. Thermistor TH2 is preferably part no. AL003006-624-61 available from Keystone.

Figure 6:
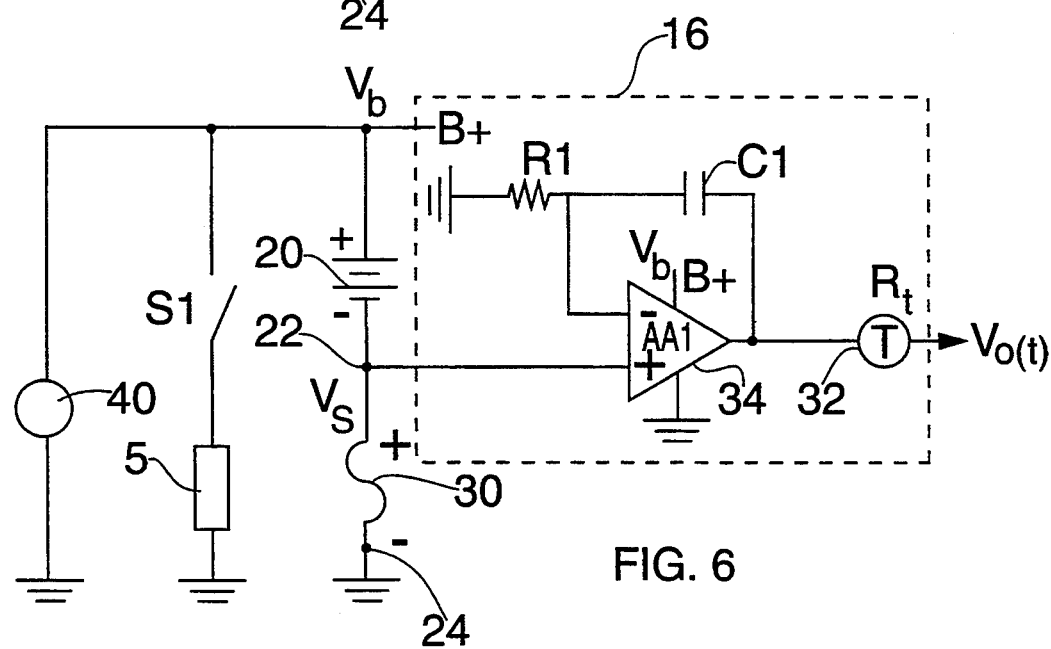
FIG. 6 is a schematic diagram for a non inverting integrating circuit of FIG. 1A.
Figure 5:
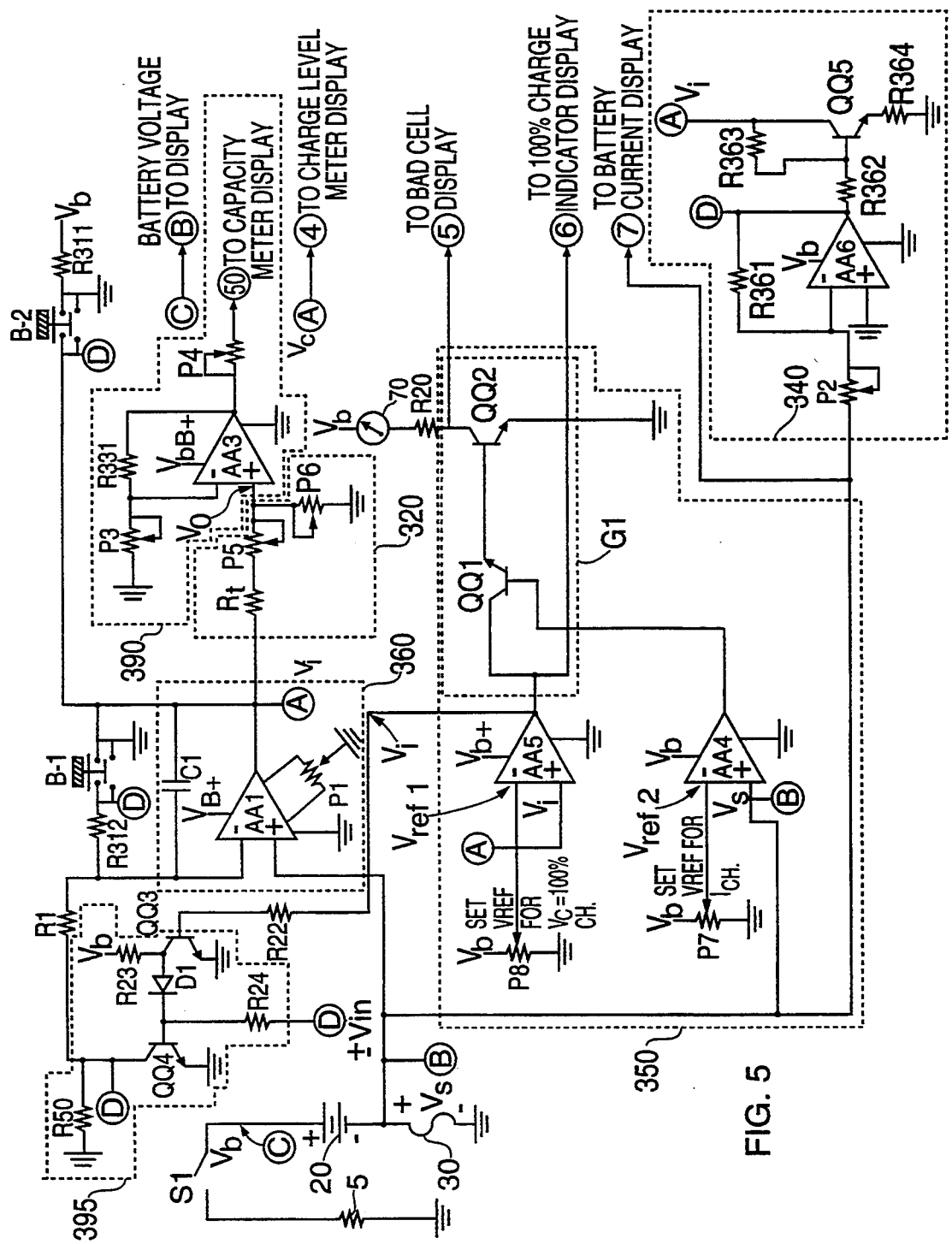
FIG. 5 is a schematic diagram of a battery state of charge monitor in accordance with an alternate preferred embodiment of the present invention.

Referring to FIGS. 5 and 6, a BSOC monitor 16 in accordance with an alternate preferred embodiment of the present invention includes an integrating operational amplifier AA1 in a non-inverting configuration. The non-inverting operational amplifier transmits voltage $V_s$ at the top of shunt resistor 30 to its non-inverting (positive) input terminal which is proportional to either discharge or charge currents through battery 20. Positive charge current voltages cause a non-inverting integrator to integrate in the positive direction. Negative discharge current voltages cause the integrator to integrate in the negative direction.

Referring to FIG. 6, non-inverting amplifier AA1 is generally operated from a single ended power supply, shown as $V_b$ to ground in FIG. 6. Consequently, it cannot operate when a negative voltage $V_s$ proportional to discharge currents appears at shunt 30 unless capacitor C1 has been previously charged to some positive voltage. In such a case, discharge currents can reduce the positive voltage on C1 when signal $V_s$ is negative and positive charge currents can increase the voltage across capacitor C1.

Accordingly, with reference to FIG. 5, integrator output $V_i$ is charged to the voltage corresponding to 100% battery charge before connecting it to a fully charged battery. It is permissible, however, to connect a fully discharged BSOC monitor integrator between the terminals of a discharged battery. The positive charge current across shunt 30 will cause the non-inverting integrator AA1 to integrate in the positive direction as it should.

The inputs to all the non-inverting switching amplifiers shown in FIG. 5 are applied to the non-inverting input so that when the voltage exceeds the reference voltage on the inverting terminal, the amplifiers will switch in the positive direction.

Referring now to FIG. 6, a positive (charge) voltage $V_s$ at node 22 will cause the voltage across capacitor C1 to increase at a rate determined by the time constant (R1)(C1) of resistor R1 and capacitor C1 and the magnitude of the input voltage $V_s$. A negative voltage will cause capacitor C1 (if charged to a positive voltage level) to discharge in the same manner as the charge rate described for a positive voltage.

The calculations below indicate the manner in which the value of resistor R1 is determined when capacitor C1 is a one farad super capacitor. In this case, the capacitor charge or discharge currents pass through resistor R1 to ground. The integrator operates in accordance with the following expression:

$$V_i(t) = 1/[(R1)(C1)] \int_0^{t_c} V_s(t)\, dt. \tag{1}$$

The equation can be reduced to $$V_i(t_c) = V_s(t_c)/[(R1)(C1)]$$

Where:

$V_s(t)$ in is the positive or negative voltage at shunt 301 at time t $t_c$ = the battery discharge time constant = amp hour rating X seconds, and R1=time constant resistance R1 (to be solved for).

The resistor value required to cause the integrator to provide an output voltage proportional to the one amp hour discharge rate of a 58 amp-hour battery is calculated as follows:

$$R1 = V_s / [(C1)\ V_i)].$$

Thus, let $V_s$ be given by $V_s$/amp=2 mv×1 amp/lamp=2 mv, and let the initial charge on capacitor C1 be 1.2 volts (corresponding to a full charge), then resistor R1=(0.002 volts) (58 amp-hours) (3600 sec. per hour)/[(1.2 volts) (1 Farad)]=348 ohms.

A switch, not indicated in FIGS. 5 and 6, but described in the U.S. Pat. No. 4,968,941, allows for selecting one of a plurality of resistors R1 having the resistances appropriate for monitoring the charge levels of batteries having various amp-hour capacity ratings. Thus, the switch is adjusted to the correct resistance for the battery being monitored.

Referring now to FIG. 5, an alternate preferred embodiment of a BSOC monitor 16 in accordance with the present invention is shown. In this embodiment, BSOC monitor 16 includes an integrator circuit 360, a battery capacity indicator circuit 320, display driver circuit 390, shorted battery detector circuit 350 and start circuit 340.

Integrator circuit 360 comprises a low power operational amplifier AA1, e.g., Model No. MC33171U, available from Motorola, having the large capacitance device C1 in the feedback path between the output and the inverting input, and the input resistor R1 is connected between the inverting input and ground. The non-inverting input is connected between shunt 30 and battery 20 so that the voltage $V_s$ across shunt 30 is input to the non-inverting input of amplifier AA1.

A balance circuit comprising a potentiometer P1 is provided across pins 1 and 5 of operational amplifier AA1 to adjust the offset voltage of integrator circuit 360, thereby providing for selecting a charging and discharging rate of capacitor C1 that better models the characteristics of battery 20. Balance potentiometer P1 is preferably a 10 KΩ potentiometer with the wiper in the center, adjusted to provide a resistance of 5 kΩ. Amplifier AA1 is energized by a supply voltage $V_b$ that is preferably obtained by direct electrical connection to battery 20. Capacitor C1 is preferably a super capacitor, having a capacitance of 1.0 farad, and resistor R1 preferably has a resistance that is adjusted to provide a required time constant for a given battery discharge rate. Thus, for the conditions described above for a 58 amp hour battery and a 1 Farad super capacitor, R1 is 348 ohms.

A switch may be provided for open-circuiting capacitor C1 from amplifier AA1 whenever battery 20 is disconnected from BSOC monitor 16 (not shown). This will minimize any self-discharge of capacitor C1 that is not correlated to the self-discharge of battery 20.

In addition, a discharge circuit comprising a switch B-1 and a resistor R312 having a resistance of 100Ω are provided for connecting the output of amplifier AA1 to ground when switch B-1 is closed. This circuit is used to clear any charge from capacitor C1, e.g., prior to charging BSOC monitor 16. Switch B-1 also allows capacitor C1 to be discharged in the event of an overcharge.

Start circuit 340 includes an operational amplifier AA2 having a 10 KΩ resistor R361 in the feedback path between the output and the inverting input. The non-inverting input is connected to ground. In this embodiment, amplifier AA2 is preferably a low power operational amplifier such as the Motorola MC 33171U with its supply voltage $V_b$ directly obtained from battery 20. A potentiometer P2 is connected between shunt 30 and the inverting input of amplifier AA2 having a resistance selectable in the range of 0 to 10 KΩ to provide amplifier AA2 with a selectable gain. Preferably potentiometer P2 is selected to be 1 KΩ. The output of amplifier AA2 is passed across a resistor R362, preferably 1 KΩ, to the base of the transistor QQ5.

The collector of transistor QQ5 is connected to the output $V_i$ of integrator circuit amplifier AA1 and also is connected to the base of transistor QQ5 by resistor R363 having a resistance of 1 MΩ. The emitter of transistor QQ5 also is connected to ground across resistor R364, having a resistance of 34Ω. Transistor QQ5 is preferably a Model No. 2N3904, generically available from Motorola.

Start circuit 340 operates in the same manner as start circuit 240 of FIG. 4, namely, to simulate the capacity changes of battery 20 during high discharge currents. Thus, transistor QQ5 will draw current from the output of integrator circuit 360, gradually increasing the battery discharge as the load current is increased, in a manner that follows the curve of decreased battery capacity as a function of the rate of current draw.

The output $V_i$ of integrator circuit 360 is passed to the input of battery capacity circuit 320 which adjusts the magnitude of signal $V_i$ in accordance with the sensed temperature of the battery 20, thereby to provide an output signal $V_o$ that reflects the charge capacity characteristic of battery 20 at the sensed temperature. Battery capacity indicator circuit 320 includes a resistor divider network including a thermistor $R_t$ in series with a potentiometer P5, which are in parallel with a potentiometer P6 which is connected to ground. Thermistor $R_t$ is preferably a model AL03006-624-G1 available from Keystone, having resistances of 2 KΩ at 77° F., 5776Ω at 32° F., and 20 KΩ at −13° F.

The output of battery capacity circuit 320 is passed to display driver circuit 390. Display driver circuit 390 includes amplifier AA3, preferably a low power operational amplifier, such as the Motorola MC 33171U with its supply voltage $V_b$ directly obtained from battery 20. A resistor R331 having a resistance of 1 MΩ is in the feedback path, between the output and the inverting input of amplifier AA3. The inverting input of amplifier AA3 is connected to ground across a potentiometer P3 having a resistance selectable in the range of 0 to 110 KΩ.

In one embodiment of the invention, amplifier AA3 has in its output a potentiometer P4, having a selectable resistance in series with a display device 50. Potentiometer P4 thus may be adjusted to scale the output voltage to be compatible with the selected display device 50. Any type of display can be used with BSOC monitor 16 provided it can be turned off when the device being monitored is turned off, e.g., with an ignition switch. Low current meters are preferably used when the BSOC display is on at all times.

In operation, battery capacity circuit 320 provides a voltage signal that varies as a function of temperature, amplified by amplifier AA3, for driving device 50. Thus, device 50 indicates battery capacity as a function of signal $V_o$ input to the non-inverting input of amplifier AA3. If display 50 is a meter adjusted to read 100% charge at a temperature of 77° F., based on the about 2

KΩ resistor provided by thermistor $R_t$, meter 50 will display a capacity of 80%, 50%, and 40% at temperatures of 32° F., −13° F., and −31 F., respectively, corresponding to the diminished capacity of battery 20 at the lower temperatures, without any loss of charge. This is because as the temperature drops, the resistance of thermistor $R_T$ increases and thus the gain of amplifier AA3 is reduced.

Switch B-2 is provided for manually charging capacitor C1 of integrator circuit 360 to the charge level corresponding to a known state of charge of battery 20. Switch B-2 is provided to close manually a circuit connecting a supply voltage $V_b$, directly obtained from battery 20, in series with resistor R311, and capacitor C1. Switch B-2 is preferably operated in conjunction with display device 50 so that when the display device reaches the known capacity of battery 20, switch B-2 is released and capacitor C1 is thereafter maintained at the appropriate charge level for the capacity. In this regard, it is noted that the output $V_i$ of integrator amplifier AA1 will typically differ from the signal $V_o$ that is input to amplifier AA3. Accordingly, the present invention provides for obtaining separately an absolute measured charge on battery 20, based on $V_i$, and the capacity of battery 20, based on $V_o$, both of which are useful for diagnostic purposes. Resistor R311 is used to set the limit of the manual charging current.

Shorted cell detector circuit 350 is provided to detect the likelihood that a cell of battery 20 is shorted. Circuit 350 includes amplifier AA4 for processing the signal $V_s$ related to the current across shunt 30, amplifier AA5 for processing the output signal $V_i$ of integrator circuit 360, and logic gate G1.

Amplifier AA4 is configured as a comparator having as one input the voltage $V_s$ across shunt 30 (positive during charging, negative during discharging). The other input is a reference voltage Vref2 obtained by dividing down supply voltage $V_b$ across a potentiometer P-7. Potentiometer P-7 is a 10 KΩ potentiometer that is selected to provide threshold voltage Vref2 that corresponds to a shorted cell charging current of, e.g., 3 amps. Potentiometer P-7 is preferably set to 1 KΩ. Accordingly, if shunt 30 has a scale factor of 2.5 mv/A, then three amps has a corresponding signal $V_s$ of 7.5 mV. Thus, whenever the charging current across shunt 30 exceeds the selected reference potential of 7.5 or 10 mV, the output of amplifier AA4 will change from a logical low state to a logical high state. Consequently, when battery 20 is charged to 100% and is a good battery, the charging current will fall below 3 amps and amplifier AA4 will fall to a low state.

Amplifier AA5 also is configured as a comparator to sense when the charge level of battery 20 is at or above a full charge level, e.g., 2.167 volts. A percent below 100% of 90% is preferably used. In this regard, output $V_i$ is input to the non inverting input of amplifier AA5 and a reference voltage Vref1 is input to the inverting input. Vref1 is obtained by dividing the supply voltage $V_b$ across a potentiometer P-8 that is adjusted to correspond to an integrator output voltage level. Preferably potentiometer P-8 is a 100 KΩ potentiometer set to 1.6 KΩ. In this embodiment, a 100% charge on battery 20 corresponds to 2.167 volts and the voltage Vref1 applied to the inverting input of amplifier AA5 is selected to be 2.0 volts corresponding to a "full" charge near a 100% charge. Thus, whenever the voltage $V_i$ exceeds the voltage Vref1 at the inverting input, the output of amplifier AA5 changes from the low state to the high state.

The output of amplifiers AA4 and AA5 are passed to respective inputs of logic gate G1. Gate G1 includes transistors QQ1 and QQ2. Gate G1 will have a logical low output at the collector of transistor QQ2 only if both amplifiers AA4 and AA5 outputs are high, corresponding to more than a specified amp charging current and a "full" battery charge, respectively. Transistor QQ1 turns transistor QQ2 on when both inputs are high. In this event, the collector of transistor QQ2 is pulled to ground which activates a bad cell display device at output 5 and reduces the charge level indicated by meter 70. The slow reduction in the state of charge of battery 20 indicated on meter 70 is determined by the value of resistor R20. The bad cell display (output 5) is used to provide an immediate indication of a bad cell when the collector of QQ2 goes low. Shunt current is read at output 7 of FIGS. 1A and 5 with a conventional plus -minus reading ammeter. An on board ammeter 70 also can be used to sense the current through the collector of transistor QQ2 and indicate a bad cell. Transistors QQ1 and QQ2 are preferably model 2N3904, generally available from Motorola.

Advantageously, the embodiment depicted in FIG. 5 uses low power operational amplifiers for amplifiers AA1, AA2, AA3, AA4, and AA5, each of which has a drain current of about 0.2 mA based on the Motorola MC33171U amplifiers. This provides for a circuit design that has a drain current of less than 2.0 mA when directly connected to battery 20 and an Altus Standard H-1 meter, customized for Use as a high resistance micrometer. Other similar display devices could be used. The low current drain allows permanent connection of BSOC monitor 16 and displays 50 and 70 to battery 20.

Thus, for a 60 Amp hour battery for an automotive vehicle, it will take more than 3 years (approximately 1250 days) to discharge a fully charged battery with a 2 mA current drain. Accordingly, in the embodiment of FIG. 5, the need for standby power circuit 220 and turn on circuits 252 and 250 of the embodiment depicted in FIG. 4 are not required. It is noted that for a capacitor of 0.01 to 1 farad, it requires about 50,000 hours to discharge fully, and it has a self discharge rate that is less then one tenth the self discharge of battery 20. It also is noted that the preferred single ended low power operational amplifiers may not be replaced with operational amplifiers requiring positive and negative input supply voltages without redesigning the circuit of FIG. 5, and that dual supply operational amplifiers are less preferred when operating with a single ended automotive type single ended power sources.

Referring to FIG. 5, BSOC monitor 16 includes a charge clamping circuit 395, including amplifier AA5, transistors QQ3 and QQ4, diode D1 and resistors R23 and R24. As noted, the reference voltage on potentiometer P8 is adjusted to a desired output voltage Vref1 corresponding to "full" battery charge. Any reference voltage between 1 and 5 volts can be selected. When the output $V_i$ of amplifier AA1 reaches the selected level, amplifier AA5 switches to the high state which raises the base of transistor QQ3 to approximately the output voltage level $V_b$ of battery 20. When the base of transistor QQ3 goes high, the base of transistor QQ4 is driven low and transistor QQ4 is turned off. This output at the collector of amplifier QQ4 is connected to capacitor C1 via node D.

Capacitor C1 cannot be either charged or discharged with transistor QQ4 turned off. Consequently, additional charge current after $V_i = Vref1$ has been reached cannot cause the integrator amplifier AA1 to integrate the trickle charge current and thus read a false overcharge condition.

It is, however, necessary to sense discharge currents and turn transistor QQ4 on again. This is accomplished by connecting the output of amplifier AA2 to the base of transistor QQ4 through resistor R24. A small discharge current will cause the base of transistor QQ4 to be raised to a level determined by the gain of amplifier AA2 (R361/P2) which turns transistor QQ4 on. The turn off signal from amplifier AA5 to the base of transistor QQ3 is thus overridden whenever a discharge current is detected. When the charge level drops below 100%, the output of amplifier AA5 returns to the low output state. Diode D1 is preferably a light emitting diode, which turns on whenever a 100% charge level is reached. This signal may be visible to the vehicle operator, if desired.

The collector of transistor QQ4 is by passed to ground with a resistor R50 that provides a constant current to ground when transistor QQ5 is turned off. This current simulates battery 20 self-leakage during long vehicle turn off periods.

BSOC monitors 16 that are not equipped with a clamping circuit 395, which limits the state of charge reading on display 50 to 100%, develop large errors over time. In most instances the vehicle alternator or other charging devices do not reduce the charge current to zero at the exact point where the battery is fully charged. Rather, small trickle current (approximately 1 amp) typically flows into a good battery for long periods of time. This is particularly true of automotive alternator/battery charging systems.

Without clamping circuit 395, the BSOC monitor 16 does not recognize that the 100% charge point has been exceeded due to the 1 amp or smaller trickle current. Consequently, capacitor C1 in FIG. 5 will charge to an output voltage level above the voltage corresponding to the 100% charge level. When a discharge condition occurs capacitor C1 will start its discharge from a higher level than it should and improperly track the battery. Once the BSOC monitor 16 loses its proper tracking point of reference, errors build up rapidly.

Clamping circuit 395 shown in FIG. 5 prevents this small trickle charge current from passing through R1 after a full charge condition is reached.

It should be noted that off board display circuits are preferably deactivated when the vehicle ignition switch is turned off. Consequently, the current drain to display 50 is not part of the 2 mA drain due to the circuit shown in FIG. 5 and on board ammeter display 70. A low cost 0 to 1 mA voltmeter can be used as an on board display, as illustrated by meter 500 in FIG. 7.

A single display meter can be switched to monitor each output from the circuit shown in FIG. 5 if desired. Each meter can be a push-the-button-to-read type meter in order to reduce the quiescent current drain of the meter to a minimum. Such a low cost meter would not likely be acceptable for most automotive displays. A seismic qualified version of the low cost meter would, however, be suitable for power plant and industrial applications. In this regard, edgewise panel reading meters are commonly used in the power industry.

A plus or minus, zero center reading ammeter or voltmeter (not shown) connected to signal $V_s$ at output 7 shown in FIG. 5 may be used to provide a reading proportional to the magnitude of the current through resistive shunt 30. Such a meter will display a positive level proportional to battery charge currents and a negative level proportional to battery discharge currents.

A voltmeter (not shown) also may be connected to battery 20 to display battery operating or open circuit terminal voltage $V_b$ (illustrated at output 8 of FIG. 5).

Referring to FIG. 3A, the input to the inverting amplifier 34A is a plus or minus voltage $V_s$ at the top of shunt 30. A negative voltage corresponding to a battery discharge current at the top of shunt 30 will transmit an input current through resistor R1 to the inverting input terminal of amplifier 34A.

The non inverting amplifier input terminal is a virtual ground point at node 24. Consequently, all the negative current through resistor R1 must pass through capacitor C1 and charge it in the positive direction. The operational amplifier output voltage $V_i$ (measured between its output and virtual ground) will increase in the positive direction at a rate proportional to the magnitude of the current through resistor R1. Amplifier 34A thus provides the gain required to linearize the charge curve.

A positive charge voltage $V_s$ due to battery charge currents at the top of shunt 30 will pass a positive current through resistor R1. Inverting amplifier 34A will thus pass all the current through resistor R1 in the discharge direction through capacitor C1 and cause it to discharge at a rate proportional to the magnitude of the current through resistor R1.

If the non inverting input is connected to ground, as is the case in the non inverting integrator circuit, the inverting amplifier configuration would not be able to measure charge currents through battery 20. It would be driven against the ground.

The non inverting integrating equation set forth above also applies to the inverting integrator configuration, except that a negative sign precedes it, to signify that an inverted output is obtained over the range of integration.

The non inverting (single ended) integrator amplifier circuit 360 shown in FIG. 5 is a preferred embodiment due to the fact that vehicle electronics is generally of the single ended type. The Motorola MC35171U amplifiers can operate from either a single or double ended input supply at voltage levels as low as 5 volts dc. Using a double ended inverting amplifier requires an additional amplifier in series with amplifier AA1 in order to cause the display devices 50, 70 to operate in the proper direction. Display meters would read plus and minus from a center off position and the operational amplifiers would operate between plus and minus 6 volts.

Referring to FIG. 7, a BSOC monitor 16 in accordance with a preferred embodiment of the present invention is shown inside housing 716, which is connected between terminals 22 and 22' of battery 20. Shunt 30 is connected between the negative terminal 22 of battery 20 and a cable 720 to vehicle ground 725, which is removed from terminal 22 and connected to post C on BSOC monitor 16. The operating area of shunt 30 is between posts 730 and 732 inside monitor 16. Post 730 is connected to a printed circuit board 750 containing the BSOC circuits, and post 732 is connected to ground. Power is brought to printed circuit board 750 from positive terminal 22' of battery 20 by a connection between posts 740 and 742.

A remote liquid crystal display 500' is shown, operated in conjunction with microprocessor 400, both of which are switched on and off with the vehicle ignition switch IS. The latter is conventional and has positions for off, accessory on, run, and start.

Alternately, a display meter 500 may be provided affixed to enclosure 716, for example, for use in non vehicular operating environments. Also shown are charge and discharge buttons B-1 and B-2. The enclosure 716 of BSOC monitor 16 is preferably made of the same material used to encase battery 20, e.g., a polymer.

In accordance with another aspect of the invention, referring to FIGS. 1 and 7, battery state of charge monitor 16 may include or be connected to a microprocessor device 400 to monitor the state of charge of battery 20 as battery 20 charges and discharges over time, to evaluate the performance of the battery charging system, and to display information concerning the battery and its charging system. More preferably, with reference to FIG. 5, a microprocessor 400 could be used to monitor one or more of the signals provided to capacity meter 50, the output of gate G1, the output of amplifier AA5, and signals $V_i$, $V_s$, $V_o$ and $V_b$, to process the monitored data and to make decisions based on the nature of the data, and to operate a liquid crystal display on the vehicle instrument panel to indicate one or more of the following measures and/or conditions: battery capacity, charge level, bad cell(s), battery voltage and current.

The qualitative status can be determined based on monitoring the charging and discharging currents rates and state of charge over time and comparing them to predetermined or historical operating conditions. The determined status, including any existing or potential problems, can then be displayed on display monitor 500 to alert the vehicle operator, incorporated into a diagnostic computer database for service technicians or both. The display 500 may be a separate display device dedicated to the battery state of charge device or incorporated into an existing executive microprocessor and message center display for the vehicle. BSOC displays and microprocessors are preferably powered through the ignition switch and therefore do not constitute a battery drain when the ignition is off.

In a preferred embodiment, such an apparatus includes BSOC monitor 16 and microprocessor 400, which is provided suitable additional software programming to process BSOC monitor 16 for these monitoring functions. A suitable microprocessor is model MC68HC05M4 or equivalent, available from Motorola. Preferably, microprocessor 400 is programmed to monitor various time intervals from detected events, e.g., starting and stopping of charging and discharging currents, determining rates of change and charge and capacity between such events, and comparing determined magnitude and rate to preselected data and historical acquired data.

Thus, microprocessor 400 may be programmed to identify when the alternator charging system 40 is unable to recharge battery 20 to one or more preselected levels of charge over a selected period of time, and to display the relative condition of the battery to the driver in more detail than the percent charge. For example, microprocessor 400 may monitor changes in the state of charge over time and determine that the battery retains a low charge level that continues to exist after a preselected time period of vehicle operation, e.g., 30 minutes. This condition corresponds to either a bad battery cell, a loose or broken alternator belt, or a burned out or inoperative alternator rectifier component. This condition can be displayed to the vehicle operator, who is prompted to have the battery charging system of the vehicle serviced so that the cause of the inability to charge the battery to a sufficient level of charge can be discovered and corrected. Display 500 may be a suitable device, as complicated as providing a written message on a liquid crystal display or other alphanumeric display or as simple as an indicator light that the system requires inspection by a service technician.

Further, microprocessor 400 may acquire detailed qualitative information of the status of the battery and its charging system and any existing or potential problems that need correction. Such information could be accessible from microprocessor 400 by a conventional diagnostic data port (not shown). Thus, a service technician can access microprocessor 400 for the detailed information identifying a reason for the service call and suggesting the likely cause of trouble.

Other examples of a microprocessor monitor for battery charging system operating conditions are as follows. A determination that the battery is being recharged at a very slow rate which does not fully charge the battery indicates that there is a low voltage regulator output voltage. A determination that the battery discharges rapidly after each recharge indicates a partial short in the wiring of the electrical system causing an excess current drain. A determination that the battery is discharging rapidly with little recharging indicates that there is an excessive current drain due to accessory overload on the electrical system. A determination that the battery state of charge has dropped to a 50% charge and the battery will not return to a near 100% charge, e.g., the selected "full" charge, after a long interval indicates that the battery has passed the deep discharge point and cannot be fully recharged. A determination that there is a continuing discharge rate proportional to current draw indicates that the ignition is off and accessories are being operated which is drawing current from the battery. Regarding the latter item, microprocessor 400 may be programmed to turn off automatically nonessential accessories, e.g., air conditioning, when the battery charge is depleted to a level that is very low, but will still start the vehicle, to minimize the likelihood of depleting the charge to a level that may not start the vehicle. Indeed, the feature may be operative even when the engine is operating, and preferably is accompanied by a suitable warning on a display device.

A determination that there is a very slow recharge after current discharge and intermittent state of charge measure changing between normal charge and zero charge indicates the possible onset of a load dump condition. A load dump is a condition when the battery suddenly disconnects from the alternator due to loose terminal connections or corrosion build-up on the battery terminals. When this occurs, the alternator is no longer loaded by the battery and the conventional alternator output voltage rises from its normal charging level of less than 16 volts to between 80 and 150 volts within a 10 msec period, and having a 400 msec decay period. This transient provides approximately 400 Joules which yields a peak instantaneous power of 1 kilowatt at the top of the pulse. Power surges of this size are difficult to clamp by state of the art solid state device, which may result in the destruction of electronic circuits on the vehicle.

In addition, microprocessor 400 may be programmed to determine and display certain qualitative characteristics of the battery which change with various operating conditions, and which thus can be controlled to some extent by the vehicle operator. For example, the amount of charge removed from the battery during starting can be used to display the instantaneous charge level and determine and display the number of charges remaining in the battery following the start. Such a display will change as the battery is recharged, which usually occurs within 30 minutes of vehicle operation. Also, the detection of a rapid battery discharge rate under high load conditions will indicate accessory overload and/or a reduction in battery capacity that occurs during conditions of high current draw, which condition will disappear when the load is decreased and the battery recharged over time. Again, microprocessor 400 may be programmed to turn off certain nonessential accessories to prevent unnecessary high load conditions. In addition, the battery discharge rate over time when the vehicle is not in use can be used to display the battery self-discharge rate, which can be monitored from time to time to ensure that the battery has sufficient charge to start the vehicle.

This aspect of the invention may be implemented in a battery state of charge monitoring device, including BSOC monitor 16, microprocessor 400 having appropriate software for processing the battery state of charge signal, and a circuit for providing the qualitative information to a display. As another alternative, the battery state of charge signals $V_i$ and $V_o$ and the signal representative of current flow across the shunt $V_s$ from BSOC may be provided to a management microprocessor already on the vehicle, which can be programmed to perform these monitoring and display functions. Preparation of suitable software is believed to be well within the abilities of a person of ordinary skill in the art. It also should be understood that the foregoing monitoring functions may be implemented using conventional discrete analog and/or digital components or solid state finite state machines, by selecting appropriate reference thresholds, clock frequency and delay periods (or pulse counts).

An advantage of this aspect of the invention is that by monitoring the charging of battery 20 through the state of charge signal output, an early warning of the onset of a load dump can be provided and load dump prevented. Similarly, because battery capacity is defined in terms of minutes, i.e., how long the vehicle can continue to be operated with a 25 amp current draw under a non-recharge condition, early warning of problems in the battery charging system can prompt the vehicle operator to seek service at a service station or to call for roadside assistance. This avoids the dangers inherent with being stranded on the side of the road, both to the operator and to other vehicle operators.

In another aspect of the present invention, the above device which monitors the battery state of charge can be combined with telemetry devices so that the state of charge, or the condition of the battery state of charge and the battery charging system can be provided to a remote station. Such a telemetry device could, for example, broadcast an FM or radio frequency signal including a code identifying the vehicle (and the location of the vehicle, e.g., with roadside interrogator stations, appropriate navigational (satellite) interrogation or tracking on a cellular telephone network and the like) and provide information regarding the status of the system, including details of an actual or potential problem and a possible solution. This would facilitate preventative maintenance and prompt, safe roadside repairs.

It is noted that references to pin numbers of integrated circuit devices are those provided by the indicated manufacturer for the identified model number of the device. Potentiometers used in the described circuits may be replaced with resistors once suitable values are obtained.

One skilled in the art will appreciate that the present invention can be practiced by other than the described embodiments which are presented for purposes of illustration and not of limitation.

I claim:

1. An apparatus for monitoring the state of an electrical energy source comprising:
    a current sensor for producing a first signal related to the magnitude and direction of the current flowing to or from said energy source; and
    a low power operational amplifier having a capacitive element in the feedback path for integrating the first signal on a continuous basis as the current flows to and from said energy source, and thereby charging the capacitive element at a rate proportional to the magnitude of the sensed current when the current flow is in one direction and discharging the capacitive element at a rate proportional to the magnitude of the sensed current when the current flow is in the opposite direction, the amplifier having a supply voltage input operatively connected to the energy source for energizing the amplifier and a minimum drain current that is less than 1.05 mA, the capacitive element having a capacitance greater than 0.01 farad.

2. The apparatus of claim 1 further comprising:
    a device for monitoring a temperature corresponding to the temperature of the energy source; and
    a circuit, responsive to the charge on the capacitive element and the sensed temperature, for providing a second signal corresponding to the capacity of the energy source at the sensed temperature.

3. The apparatus of claim 1 further comprising a circuit for detecting when the energy source is defective in response to the sensed charge on the capacitive element and the sensed charging current.

4. The apparatus of claim 1 further comprising a circuit for clamping the charge on the capacitive element at a value corresponding to a full charge in the energy source when the energy source is fully charged.

5. The apparatus of claim 1 wherein the low power operational amplifier has a drain current on the order of 0.2 mA.

6. A method of monitoring the state of an electrical energy source comprising the steps of:
    sensing the direction and amount of current flow into and out of the energy source as a first signal;
    providing an integrating circuit including a capacitive element having an effective capacity of more than 0.01 farad and a time constant resistor through which the capacitor charges or discharges, a supply voltage input, and an input for receiving the first signal from the current sensor;
    energizing the circuit by operative connection of the supply voltage input to the energy source being monitored, the circuit having a minimum drain current that is less than or equal to 1.0 mA; and charging the capacitive element in response to the first signal in one direction, at a charge rate that is in proportion to the amount of the first signal, and discharging the capacitive element in response to the first signal in the opposite direction, at a discharge rate that is in proportion to the amount of the first signal, thereby providing an integrated first signal corresponding to the state of charge of the energy source.

7. The method of claim 6 wherein providing the integrating circuit further comprises providing a low power operational amplifier having a drain current that is less than 0.5 mA, wherein the capacitive element is in the feedback loop.

8. The method of claim 6 further comprising:
monitoring a temperature corresponding to the temperature of the energy source;
processing the integrated first signal in response to the sensed temperature; and
providing a second signal corresponding to the capacity of the energy source at the sensed temperature.

9. The method of claim 6 further comprising detecting when the energy source is defective in response to the sensed charge on the capacitive element and the sensed charging current.

10. The method of claim 6 further comprising clamping the charge on the capacitive element at a value corresponding to a full charge in the energy source when the energy source is fully charged.

11. An apparatus for monitoring the state of an electrical energy source comprising:
a current sensor for producing an output current signal related to the magnitude and direction of the current flowing to or from said energy source;
an integrator circuit having a feedback path including a charge storing capacitive element with low self leakage, a resistor which in conjunction with the capacitive element provides a time constant for integrating the output current signal on a continuous basis as the current flows to and from said energy source, and an output for providing the integrated output signal stored in the capacitive element corresponding to the state of charge of the energy source;
the capacitive element being charged at a rate proportional to the magnitude of the sensed current when the current flow is in one direction and discharged at a rate proportional to the magnitude of the sensed current when the current flow is in the opposite direction;
means for sensing and processing the sensed magnitude and direction of the output signal and the amplitude of the integrated output signal, thereby to indicate the charge condition of the energy source;
a device to monitor a temperature corresponding to the temperature of the energy source; and
a circuit, responsive to the monitored temperature, providing a first signal corresponding to the capacity of the energy source at the monitored temperature.

12. The apparatus of claim 11 wherein the energy source has a charge capacity and a self discharge rate that vary with temperature, the apparatus further comprising a temperature compensation circuit for providing the first signal related to the state of the energy source at the monitored temperature.

13. The apparatus of claim 12 wherein the temperature compensation circuit further comprises:
a first circuit for adjusting the effective self-discharge rate of the capacitive device in response to the sensed temperature so that the integrated output signal stored in the capacitive element corresponds to the state of the energy source at the sensed temperature; and
a second circuit for adjusting the charging rate and discharging rate of the capacitive device in response to the sensed temperature so that the integrated output signal is related to the state of the energy source at the sensed temperature.

14. The apparatus of claim 11 further comprising a circuit for detecting when the energy source is defective in response to the integrated output signal stored in the capacitive element and the sensed charging current.

15. The apparatus of claim 14 wherein the circuit further comprises a first means for comparing the integrated output voltage to a first threshold corresponding to a full charge voltage and a second means for comparing the sensed amplitude of a charging current to a second threshold corresponding to a current passing through a defective element in the energy source.

16. The apparatus of claim 11 wherein the capacitive element further comprises a capacity selected in the range between 0.01 and 1.0 farad.

17. The apparatus of claim 11 wherein the capacitive element further comprises a self discharge rate that is at or less than one tenth the self discharge rate of the energy source.

18. The apparatus of claim 11 wherein the capacitive element further comprises a charge storage life of at least 40,000 hours.

19. The apparatus of claim 11 further comprising a circuit for maintaining the integrated output signal stored in the capacitive element at a level corresponding to a 100% charge on the energy source during the presence of a continuing charging current.

20. The apparatus of claim 11 wherein the sensing and processing means further comprises a microprocessor.

21. The apparatus of claim 11 wherein the energy source is an automotive battery in an automotive vehicle having an alternator-battery charging system and accessory circuits and the indicated charge condition is selected from among one or more of the group consisting of a load dump condition, a defective battery cell, a defective alternator belt, a defective alternator rectifier component, a low voltage regulator output, an excessive current drain corresponding to a short in the vehicle electrical system, the battery having been discharged below the deep discharge point, and the battery charge falling below a preselected charge threshold.

22. The apparatus of claim 11 wherein the energy source is an automotive battery in an automotive vehicle having one or more accessory circuits connectable to the battery, and further comprising a circuit for disconnecting at least one selected accessory circuit from the battery when the sensed charge is below a selected charge threshold.

23. The apparatus of claim 11 wherein the energy source is an automotive battery in an automotive vehicle having an alternator-battery charging system and accessory circuits further comprising a circuit for transmitting a signal corresponding to the determined charge condition to a remote location.

24. The apparatus of claim 23 wherein the indicated charge condition is selected from among one or more of the group consisting of a load dump condition, a defective battery cell, a defective alternator belt, a defective alternator rectifier component, a low voltage regulator output, an excessive current drain corresponding to a short in the vehicle electrical system, the battery having been discharged below the deep discharge point, and the battery charge falling below a preselected charge threshold.

25. The apparatus of claim 11 further comprising means for displaying a message corresponding to the indicated charge condition.

26. A method of monitoring the state of an electrical energy source comprising the steps of:
sensing the direction and amount of current flow into and out of the energy source;
integrating the net amount of said current flow continuously as current flows into and out of said energy source;
the step of integrating comprising charging a capacitive element having an effective capacity of 0.01 farad or more in response to current flow in one direction, at a charge rate that is in proportion to the amount of current flow, and discharging the capacitive element in response to current flow in the opposite direction at a discharge rate that is in proportion to the amount of current flow, thereby providing an integrated output signal corresponding to the state of charge; and
determining whether or not the energy source has a short condition in response to the sensed charging current flow and the sensed integrated output signal.

27. The method of claim 26 wherein the energy source is a battery having at least one battery cell and the step of determining whether or not the energy source has a short condition further comprises:
comparing the sensed charging current flow to a first threshold corresponding to a charging current of one short circuited battery cell;
comparing the integrated output signal to a second threshold corresponding to a near full charge; and
indicating a short in the energy source when the sensed charging current is above the first threshold and the integrated output signal is at or greater than the second threshold.

28. A method of monitoring the state of an electrical energy source comprising the steps of:
sensing the direction and amplitude of current flow into and out of the energy source as a first signal;
providing an integrator circuit having a feedback path including a charge storing capacitive element with low self leakage, and a resistor which in conjunction with the capacitive element provides an integration time constant;
charging the capacitive element in response to the first signal in one direction, at a charge rate that is in proportion to the amount of the first signal, and discharging the capacitive element in response to the first signal in the opposite direction, at a discharge rate that is in proportion to the amount of the first signal, thereby providing an integrated output signal stored in the capacitive element corresponding to the state of charge of the energy source;
sensing and processing the direction and amplitude of the first signal and the amplitude of the integrated output signal, thereby to indicate the condition of the electrical energy source;
monitoring a temperature corresponding to the temperature of the electrical energy source; and
providing a signal corresponding to the state of the electrical energy source at the monitored temperature.

29. The method of claim 28 wherein the step of providing the signal further comprises:
adjusting the effective self-discharge rate of the capacitive device in response to the sensed temperature so that the integrated output signal stored in the capacitive element corresponds to the state of the energy source at the sensed temperature; and
adjusting the charging rate and discharging rate of the capacitive device in response to the sensed temperature so that the integrated output signal is related to the state of the energy source at the sensed temperature.

30. The method of claim 27 further comprising detecting when the energy source is defective in response to the integrated output signal and the sensed charging current.

31. The method of claim 30 further comprising determining that the energy source is defective when the integrated output voltage corresponds to a full charge state of the energy source and the sensed charging current is higher than the charging current should be for the charge represented by the integrated output signal.

32. The method of claim 28 further comprising
adjusting the integrated output signal in response to the monitored temperature.

33. The method of claim 28 further comprising maintaining the integrated output signal stored in the capacitive element at a level corresponding to a full charge on the energy source during the presence of a continuing charging current.

34. The method of claim 28 wherein the step of sensing and processing is performed under microprocessor control.

35. The method of claim 28 wherein the energy source is an automotive battery in an automotive vehicle having an alternator-battery charging system and accessory circuits and the step of sensing and processing indicates a charge condition selected from among one or more of the group consisting of a load dump condition, a defective battery cell, a defective alternator belt, a defective alternator rectifier component, a low voltage regulator output, an excessive current drain corresponding to a short in the vehicle electrical system, the battery having been discharged below the deep discharge point, and the battery charge falling below a preselected charge threshold.

36. The method of claim 28 wherein the energy source is an automotive battery in an automotive vehicle having one or more accessory circuits connectable to the battery, and further comprising the step of disconnecting at least one selected accessory circuit from the battery when the sensed charge is below a selected charge threshold.

37. The method of claim 27 wherein the energy source is an automotive battery in an automotive vehicle having an alternator-battery charging system and accessory circuits further comprising transmitting a signal corresponding to the indicated charge condition to a remote location.

38. The method of claim 37 wherein the indicated charge condition is selected from among one or more of the group consisting of a load dump condition, a defective battery cell, a defective alternator belt, a defective alternator rectifier component, a low voltage regulator output, an excessive current drain corresponding to a short in the vehicle electrical system, the battery having been discharged below the deep discharge point, and the battery charge falling below a preselected charge threshold.

39. The method of claim 28 further comprising displaying a message corresponding to the indicated charge condition.

40. An apparatus for monitoring the state of an electrical energy source having a charge capacity that changes with the temperature comprising:
 a current sensor for producing a first signal related to the magnitude and direction of the current flowing to or from said energy source;
 a capacitive element having a capacitance of 0.01 farad or more connected to said current sensor for integrating said first signal on a continuous basis as the current flows to and from said energy source, said capacitive element charging at a rate proportional to the magnitude of the sensed current when the current flow is in one direction and discharging at a rate proportional to the magnitude of the sensed current when the current flow is in the opposite direction and producing a second signal corresponding to the state of charge of the energy source;
 a device for monitoring a temperature corresponding to the temperature of the energy source; and
 a circuit, responsive to the second signal and the sensed temperature, for providing a third signal corresponding to the capacity of the energy source at the sensed temperature.

41. The apparatus of claim 40 further comprising:
 an operational amplifier having the capacitive element in the feedback path and a time constant resistor through which the first signal is integrated and an output for providing the second signal;
 wherein the device for monitoring temperature is a thermistor and the circuit further comprises a voltage divider network, connected in series with the thermistor and the output of the operational amplifier, for adjusting the amplitude of the second signal to correspond to the capacity of the battery at the sensed temperature.

42. The apparatus of claim 40 wherein the circuit further comprises a first circuit for adjusting the self-discharge rate of the capacitive element in response to the sensed temperature so that the integrated first signal stored in the capacitive element is discharged at a rate corresponding to the charge capacity of the energy source at the sensed temperature.

43. The apparatus of claim 42 wherein the device for monitoring temperature is a first thermistor and the first circuit further comprises:
 an operational amplifier having the capacitive element in the feedback path and an input resistor across which the first signal is passed for integrating the first signal, and an output for providing the second signal; and
 a voltage source and a resistor connected in series with the thermistor connected between the resistor and the operational amplifier output.

44. The apparatus of claim 43 further comprising:
 a second device for monitoring a temperature corresponding to the temperature of the energy source; and
 a second circuit for adjusting the charging rate and discharging rate of the capacitive sensor in response to the sensed temperature so that the second signal is related to the state of the energy source at the sensed temperature.

45. The apparatus of claim 44 wherein the second device for monitoring temperature is a second thermistor and the second circuit further comprises an unbalance circuit including the second thermistor for adjusting the offset voltage of the operational amplifier to correspond to the charge capacity of the battery at the sensed temperature.

46. The apparatus of claim 40 wherein the device for monitoring temperature is a thermistor and the circuit further comprises:
 an operational amplifier having the capacitive element in the feedback path and an input resistor across which the first signal is passed for integrating the first signal and an output for providing the second signal; and
 an unbalance circuit including the thermistor for adjusting the offset voltage of the operational amplifier to correspond to the charge capacity of the battery at the sensed temperature.

47. The apparatus of claim 40 further comprising:
 a first circuit for detecting a short circuit in the energy source.

48. The apparatus of claim 47 wherein the first circuit further comprises:
 a first comparator for comparing the sensed charging current to a first threshold corresponding to a charging current;
 a second comparator for comparing the sensed second signal to a second threshold corresponding to a full charge; and
 means for indicating a short in the battery when the magnitude of the sensed output current is a charging current greater than the first threshold and the sensed integrated output signal is at or greater than the second threshold.

49. A method of monitoring the state of an electrical energy source comprising the steps of:
 sensing the direction and amount of current flow into and out of the energy source;
 integrating the net amount of said current flow continuously as current flows into and out of said energy source and providing a first signal corresponding to the net charge in the energy source;
 the step of integrating comprising charging a capacitive element having an effective capacity of more than 0.01 farad in response to current flow in one direction, at a charge rate that is in proportion to the amount of current flow, and discharging the capacitive element in response to current flow in the opposite direction, at a discharge rate that is in proportion to the amount of current flow;
 monitoring a temperature corresponding to the temperature of the energy source; and
 adjusting the first signal in response to the sensed temperature and providing a second signal corresponding to the charge capacity of the energy source at the sensed temperature.

50. The method of claim 49 wherein adjusting the first signal further comprises adjusting the amplitude of the first signal to correspond to the charge capacity of the energy source at the sensed temperature.

51. The method of claim 49 wherein adjusting the first signal further comprises adjusting the offset voltage of the integration of the current flow so that the charge rate and discharge rate of the capacitive device correspond to the charge capacity of the energy source at the sensed temperature.

52. The method of claim 49 wherein adjusting the first signal further comprises adjusting the self-discharge rate of the capacitive element to correspond to the self-discharge rate of the energy source at the sensed temperature.

53. An apparatus for monitoring the state of an electrical energy source comprising:
   a current sensor for producing an output signal related to the magnitude and direction of the current flowing to or from said energy source;
   an operational amplifier having a capacitive element in the feedback path and a time constant resistor through which the output signal is integrated on a continuous basis as the current flows to and from said energy source and an output for providing the integrated output signal corresponding to the state of charge of the energy source, the capacitive element having an effective capacitance of 0.01 farad or more and charging at a rate proportional to the magnitude of the sensed current when the current flow is in one direction, discharging at a rate proportional to the magnitude of the sensed current when the current flow is in the opposite direction, and having a self-discharge rate when no sensed current flows to or from the energy source; and
   a circuit for detecting a short circuit in the energy source.

54. The apparatus of claim 53 wherein the circuit further comprises:
   a first comparator for comparing the sensed integrated output signal to a first threshold corresponding to a full charge in the energy source;
   a second comparator for comparing the sensed current to a second threshold corresponding to a charging current that is greater than what the charging current should be when the energy source is at a near full charge; and
   means for indicating a short in the energy source when the sensed output current is a charging current greater than the first threshold and the integrated output signal is at or greater than the second threshold.

55. The apparatus of claim 54 wherein the indicating means is a device having one output state indicative of a short in the energy source.

56. The apparatus of claim 54 wherein the indicating means further comprises a visual display device having a first display condition indicative of a short in the energy source and a second display condition not indicative of a short in the energy source.

57. The apparatus of claim 53 wherein the energy source is a battery having at least one battery cell, the circuit further comprises:
   a first comparator for comparing the sensed current to a first threshold corresponding to a charging current of one short circuited battery cell;
   a second comparator for comparing the sensed integrated output signal to a second threshold corresponding to a full charge; and
   means for indicating a short in the energy source when the sensed output current is a charging current greater than the first threshold and the integrated output signal is at or greater than the second threshold.

58. The apparatus of claim 57 wherein the indicating means is a device having one output state indicative of a short in the energy source.

59. The apparatus of claim 57 wherein the indicating means further comprises a visual display device having a first display condition indicative of a short in the energy source and a second display condition not indicative of a short in the energy source.

60. An apparatus for monitoring the state of an electrical energy source comprising:
   a current sensor for producing an output signal related to the magnitude and direction of the current flowing to or from said energy source;
   an operational amplifier having a capacitive element in the feedback path and a time constant resistor through which the output signal is integrated on a continuous basis as the current flows to and from said energy source and an output for providing the integrated output signal corresponding to the state of charge of the energy source, the capacitive element charging at a rate proportional to the magnitude of the sensed current when the current flow is in one direction, and discharging at a rate proportional to the magnitude of the sensed current when the current flow is in the opposite direction; and
   means for determining whether or not the energy source is defective in response to the charging current flow and the integrated output signal.

61. The apparatus of claim 60 wherein the circuit further comprises:
   a circuit limiting the charge on the capacitive element to a level corresponding to a full charge on the electrical energy source during a continuing charging current; and
   an indicator for indicating when the energy source is fully charged.

62. The apparatus of claim 60 wherein the circuit further comprises:
   a first comparator for comparing the integrated output signal to a first threshold corresponding to a full charge on the electrical energy source; and
   a switch for inhibiting the capacitive element from charging further in response to a continuing charging current when the integrated output signal is at or greater than the first threshold.

63. A method of monitoring the state of an electrical energy source comprising the steps of:
   sensing the direction and amount of current flow into and out of the energy source;
   integrating the net amount of said current flow continuously as current flows into and out of said energy source;
   the step of integrating comprising charging a capacitive element in response to current flow in one direction, at a charge rate that is in proportion to the amount of current flow, and discharging the capacitive element in response to current flow in the opposite direction at a discharge rate that is in proportion to the amount of current flow, thereby providing an integrated output signal corresponding to the state of charge of the energy source; and determining whether or not the energy source is defective in response to the charging current flow and the integrated output signal.

64. The method of claim 63 further comprising:
limiting the charge on the capacitive element to a level corresponding to a full charge on the electrical energy source during a continuing charging current; and
indicating when the energy source is fully charged.

65. The method of claim 63 further comprising:
comparing the integrated output signal to a first threshold corresponding to a full charge on the electrical energy source; and
inhibiting the capacitive element from charging in response to a charging current when the integrated output signal is at or greater than the first threshold.

* * * * *